US008916653B2

(12) United States Patent
Choi et al.

(10) Patent No.: US 8,916,653 B2
(45) Date of Patent: Dec. 23, 2014

(54) CURABLE COMPOSITION

(71) Applicant: LG Chem, Ltd., Seoul (KR)

(72) Inventors: Bum Gyu Choi, Daejeon (KR); Min Jin Ko, Daejeon (KR); Myung Sun Moon, Daejeon (KR); Jae Ho Jung, Daejeon (KR); Dae Ho Kang, Daejeon (KR); Min Kyoun Kim, Daejeon (KR); Byung Kyu Cho, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/935,857

(22) Filed: Jul. 5, 2013

(65) Prior Publication Data

US 2013/0293808 A1 Nov. 7, 2013

Related U.S. Application Data

(63) Continuation of application No. PCT/KR2012/000183, filed on Jan. 6, 2012.

(30) Foreign Application Priority Data

Jan. 6, 2011 (KR) .................. 10-2011-0001457
Jan. 6, 2012 (KR) .................. 10-2012-0002157

(51) Int. Cl.
| | | |
|---|---|---|
| H01L 23/29 | (2006.01) | |
| C08L 83/04 | (2006.01) | |
| H01L 33/56 | (2010.01) | |
| H01L 33/52 | (2010.01) | |
| G02F 1/1335 | (2006.01) | |
| C08G 77/20 | (2006.01) | |
| C08G 77/14 | (2006.01) | |
| C08G 77/12 | (2006.01) | |

(52) U.S. Cl.
CPC .............. *H01L 33/52* (2013.01); *C08G 77/20* (2013.01); *H01L 33/56* (2013.01); *C08G 77/14* (2013.01); *C08L 83/04* (2013.01); *G02F 1/133603* (2013.01); *H01L 23/29* (2013.01); *H01L 23/296* (2013.01); *C08G 77/12* (2013.01)
USPC .............. 525/478; 525/477; 528/43; 257/788; 257/791

(58) Field of Classification Search
None
See application file for complete search history.

(56) References Cited

U.S. PATENT DOCUMENTS

| | | | |
|---|---|---|---|
| 6,432,137 B1 | 8/2002 | Nanushyan et al. | |
| 7,521,813 B2 | 4/2009 | Kashiwagi et al. | |
| 7,851,564 B2 | 12/2010 | Murai et al. | |
| 8,258,502 B2 | 9/2012 | Yoshitake et al. | |
| 8,614,282 B2 * | 12/2013 | Hamamoto et al. | .......... 525/477 |
| 2008/0007158 A1 | 1/2008 | Farooq et al. | |

FOREIGN PATENT DOCUMENTS

| | | |
|---|---|---|
| JP | 11-274571 A | 10/1999 |
| JP | 2001-196151 A | 7/2001 |
| JP | 2002-226551 A | 8/2002 |
| JP | 2009-527622 A | 7/2009 |
| WO | WO 2009/154260 A1 * | 12/2009 |

OTHER PUBLICATIONS

International Search Report issued in International Application No. PCT/KR2012/000183 mailed Sep. 24, 2012, 2 pages.
Office Action issued in Chinese Patent Application No. 201280011543.2 on Jun. 25, 2014 along with English translation, 17 pages.

* cited by examiner

*Primary Examiner* — Marc Zimmer
(74) *Attorney, Agent, or Firm* — Rothwell, Figg, Ernst & Manbeck, P.C.

(57) ABSTRACT

A curable composition and use thereof are provided. The exemplary curable composition can show excellent processability and workability. Also, the curable composition can have a high refractive index before or after curing. The composition has low moisture permeability before or after curing and shows excellent crack resistance, thermal shock resistance, adhesive property and hardness. In addition, the composition does not cause color change such as whitening under a high-temperature or high-humidity condition, and does not exhibit stickiness on a surface thereof. The curable composition may be used as an adhesive material or as an encapsulation material for semiconductor devices such as an LED, a CCD, a photo coupler, or a photovoltaic cell.

18 Claims, No Drawings

CURABLE COMPOSITION

CROSS REFERENCE TO RELATED APPLICATION

This application is a continuation of PCT/KR2012/000183 filed Jan. 6, 2012, which claims the benefit of Korean Patent Application Nos. 10-2011-0001457 filed Jan. 6, 2011 and 10-2012-0002157 filed Jan. 6, 2012, the disclosures of which are incorporated herein in their entirety by reference.

TECHNICAL FIELD

The present invention relates to a curable composition and use thereof.

BACKGROUND ART

As light emitting diodes (LEDs), particularly blue or ultraviolet (UV) LEDs having an emission wavelength of approximately 250 nm to 550 nm, high-brightness products using a compound semiconductor made of a GaN-based compound such as GaN, GaAlN, InGaN or InAlGaN have been developed. Also, it is possible to form a high-definition full-color image using a technique of combining the above-described blue LEDs with red and green LEDs. For example, there is a known technique of manufacturing a white LED by combining a blue or UV LED with a fluorescent material. Such a white LED is expected to be increasingly used for backlights of liquid crystal display devices (LCDs) or general lighting.

An epoxy resin having a high adhesive property and excellent dynamic durability has been widely used as an LED encapsulation material. However, the epoxy resin has problems in that it has low transmittance with respect to light ranging from blue to UV wavelength ranges, and also shows poor light resistance. Accordingly, for example, Patent Documents 1 to 3 disclose techniques proposed to solve the above-mentioned problems. However, the encapsulation materials as described in the above-mentioned patent documents have a problem in that they still show poor light resistance.

Meanwhile, a silicone resin has been known as a material having excellent light resistance at a low wavelength range. However, the silicone resin has problems in that it shows low heat resistance and has a sticky surface after a curing process. To effectively employ the silicone resin as an encapsulation material for LEDs, it is also necessary to ensure characteristics such as a high-refractive index characteristic, crack resistance, surface hardness, adhesive strength and thermal shock resistance.

PRIOR ART DOCUMENTS

Patent Documents

Patent Document 1: Japanese Patent Laid-open Publication No. Hei11-274571
Patent Document 2: Japanese Patent Laid-open Publication No. 2001-196151
Patent Document 3: Japanese Patent Laid-open Publication No. 2002-226551

DISCLOSURE

Technical Problem

The present invention is directed to providing a curable composition and use thereof.

Technical Solution

One aspect of the present invention provides a curable composition. The curable composition according to one exemplary embodiment may include a linear polysiloxane containing an alkenyl group bound to a silicon atom, and a silicon compound containing a hydrogen atom bound to a silicon atom (hereinafter simply referred to as a "silicon compound"). According to one exemplary embodiment, the curable composition may be a composition which is cured by a hydrosilylation reaction.

In this specification, the term "unit M" may refer to a siloxane unit forming a polysiloxane, that is, a monofunctional siloxane unit which is represented by the expression $(R_3SiO_{1/2})$ known in the related art, the term "unit D" may refer to a siloxane unit forming a polysiloxane, that is, a difunctional siloxane unit which is represented by the expression $(R_2SiO_{2/2})$ known in the related art, the term "unit T" may refer to a siloxane unit forming a polysiloxane, that is, a trifunctional siloxane unit which is represented by the expression $(RSiO_{3/2})$ known in the related art, and the term "unit Q" may refer to a siloxane unit forming a polysiloxane, that is, a tetrafunctional siloxane unit which is represented by the expression $(SiO_{4/2})$ known in the related art. In the units M, D and T, specific kinds of the substituent "R" binding to a silicon atom will be described later.

According to one exemplary embodiment, the linear polysiloxane may include all siloxane units represented by the following Formulas 1 to 3. Each of the siloxane units of the following Formulas 1 to 3 is a unit D forming a linear polysiloxane.

$$R^a R^b SiO_{2/2} \qquad \text{[Formula 1]}$$

$$R^c R^d SiO_{2/2} \qquad \text{[Formula 2]}$$

$$R^c R^f SiO_{2/2} \qquad \text{[Formula 3]}$$

In Formulas 1 to 3, $R^a$ and $R^b$ are each independently an aryl group having 6 to 25 carbon atoms, $R^f$ is hydrogen, an alkyl group having 1 to 20 carbon atoms, an alkoxy group having 1 to 20 carbon atoms, a hydroxyl group, an epoxy group, an alkenyl group having 2 to 20 carbon atoms, or an aryl group having 6 to 25 carbon atoms, $R^c$ and $R^d$ are each independently an alkyl group having 1 to 20 carbon atoms, $R^e$ is an alkenyl group having 2 to 20 carbon atoms.

Unless particularly defined otherwise in this specification, the term "alkyl group" may, for example, refer to an alkyl group having 1 to 20 carbon atoms, 1 to 16 carbon atoms, 1 to 12 carbon atoms, 1 to 8 carbon atoms, or 1 to 4 carbon atoms. The alkyl group may have a linear, branched or cyclic structure, and may be optionally substituted with one or more substituents. For example, the alkyl group that may be used herein may include a methyl group, an ethyl group, a propyl group, an isopropyl group, a butyl group, an isobutyl group, a tert-butyl group, a pentyl group, a neopentyl group, a hexyl group, a cyclohexyl group, an octyl group, a nonyl group, or a decyl group.

Unless particularly defined otherwise in this specification, the term "alkoxy group" may, for example, refer to an alkoxy group having 1 to 20 carbon atoms, 1 to 16 carbon atoms, 1 to 12 carbon atoms, 1 to 8 carbon atoms, or 1 to 4 carbon atoms. The alkoxy group may have a linear, branched or cyclic structure, and may be optionally substituted with one or more substituents. For example, the alkoxy group that may be used herein may include a methoxy group, an ethoxy group, a propoxy group, an isopropoxy group, a butoxy group, an isobutoxy group, or a tert-butoxy group.

Unless particularly defined otherwise in this specification, the term "alkenyl group" may, for example, refer to an alkenyl group having 2 to 20 carbon atoms, 2 to 16 carbon atoms, 2 to 12 carbon atoms, 2 to 8 carbon atoms, or 2 to 4 carbon atoms. The alkenyl group may have a linear, branched or cyclic structure, and may be optionally substituted with one or more substituents. For example, the alkenyl group that may be used herein may include a vinyl group, an allyl group, a propenyl group, an isopropenyl group, a butenyl group, a hexenyl group, a cyclohexenyl group, an octenyl group, or a decenyl group.

Unless particularly defined otherwise in this specification, the term "epoxy group" may, for example, refer to a monovalent residue derived from a cyclic ether having three ring-forming atoms, or a compound including the cyclic ether. The epoxy group that may be used herein may include a glycidyl group, an epoxyalkyl group, a glycidoxyalkyl group, or an alicyclic epoxy group. As such, the alicyclic epoxy group may, for example, refer to a monovalent residue that has an aliphatic hydrocarbon ring structure and is derived from a compound having a structure in which two carbon atoms used to form the aliphatic hydrocarbon ring are also used to form an epoxy group. The alicyclic epoxy group may be an alicyclic epoxy group having 6 to 12 carbon atoms, for example, a 3,4-epoxycyclohexylethyl group.

Unless particularly defined otherwise in this specification, the term "aryl group" may also refer to a monovalent residue derived from a compound or a derivative thereof, which contains a benzene ring and has a structure in which two or more benzene rings are connected or condensed. In general, a category of the term "aryl group" may include an aralkyl group or an arylalkyl group in addition to the aryl groups normally referred to as aryl groups. For example, the aryl group may be an aryl group having 6 to 25 carbon atoms, 6 to 21 carbon atoms, 6 to 18 carbon atoms, or 6 to 12 carbon atoms. Examples of the aryl group may include a phenyl group, a dichlorophenyl, a chlorophenyl, a phenylethyl group, a phenylpropyl group, a benzyl group, a tolyl group, a xylyl group, or a naphthyl group.

In this specification, examples of the substituent which may be optionally substituted with the alkyl group, the alkenyl group, the alkoxy group, the epoxy group or the aryl group may include a halogen, an epoxy group, an acryloyl group, a methacryloyl group, an isocyanate group, a thiol group, a hydroxyl group, an alkyl group, an alkenyl group, an alkoxy group, an epoxy group, or an aryl group, but the present invention is not limited thereto.

As such, $R^f$ in the siloxane unit of Formula 3 may, for example, be an alkyl group having 1 to 20 carbon atoms.

In the linear polysiloxane, a mole number of the siloxane unit of Formula 1 may be 1 to 5 times, or 1.5 to 3 times, as large as that of the siloxane unit of Formula 2. Within this mole number range, viscosity and a refractive index of the curable composition or cured product thereof may be properly maintained.

Also, in the linear polysiloxane, a mole number of the siloxane unit of Formula 3 may be 0.005 to 0.05 times, or 0.01 to 0.05 times, as large as that of the sum of the siloxane units of Formulas 1 and 2. Within this mole number range, hardness, viscosity and a refractive index of a curable composition or a cured product thereof may be properly maintained.

The linear polysiloxane may include at least one alkenyl group bound to a silicon atom. According to one exemplary embodiment, the linear polysiloxane may include at least an alkenyl group bound to a silicon atom present in an end of the polysiloxane. For example, the linear polysiloxane may include at least an alkenyl group(s) bound to a silicon atom(s) of the unit M present in one or both ends of the polysiloxane. However, the alkenyl group may also be bound to a side chain of the linear polysiloxane, that is, a unit D forming the main chain.

According to one exemplary embodiment, a molar ratio (Ak/Si) of the total alkenyl groups (Ak) bound to silicon atoms present in the linear polysiloxane with respect to the total silicon atoms (Si) present in the linear polysiloxane may be, for example, in a range of 0.02 to 0.2, or 0.02 to 0.15. Within this molar ratio range, a curing property of a composition, and surface characteristics, hardness and crack resistance of a cured product may be excellently maintained.

According to one exemplary embodiment, the linear polysiloxane may have a viscosity at 25° C. of, for example, 500 cP to 100,000 cP, or 500 cP to 50,000 cP. Within this viscosity range, processability and hardness characteristics of the curable composition may be properly maintained.

According to one exemplary embodiment, the linear polysiloxane may have a weight average molecular weight ($M_w$) of, for example, approximately 500 to 50,000, or approximately 500 to 30,000. In this specification, the term "weight average molecular weight" refers to a value converted with respect to a polystyrene standard as measured by gel permeation chromatography (GPC). Unless particularly defined otherwise in this specification, the term "molecular weight" may also refer to a weight average molecular weight. Within this molecular weight range, viscosity, formability, hardness, crack resistance and strength characteristics of the curable composition or cured product thereof may be properly maintained.

According to one exemplary embodiment, the linear polysiloxane may be represented by the following Formula A.

[Formula A]

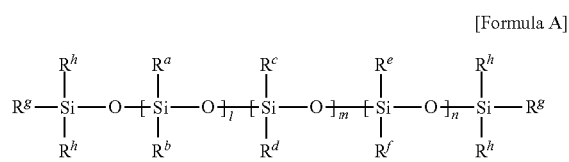

In Formula A, $R^a$ and $R^b$ are each independently an aryl group having 6 to 25 carbon atoms, $R^f$ is hydrogen, an alkyl group having 1 to 20 carbon atoms, an alkoxy group having 1 to 20 carbon atoms, a hydroxyl group, an epoxy group, an alkenyl group having 2 to 20 carbon atoms, or an aryl group having 6 to 25 carbon atoms, $R^c$ and $R^d$ are each independently an alkyl group having 1 to 20 carbon atoms, $R^e$ is an epoxy group, $R^g$ is an alkenyl group having 2 to 20 carbon atoms, $R^h$ is each independently an alkyl group having 1 to 20 carbon atoms, and l, m and n are positive numbers.

In Formula A, $R^f$ may, for example, be an alkyl group.

In Formula A, l, m and n represent values of the unit D of Formula 1, the unit D of Formula 2 and the unit D of Formula 3, respectively. For example, l may be in a range of approximately 1 to 500, approximately 1 to 400, approximately 1 to 300, approximately 1 to 200, approximately 1 to 100, approximately 1 to 90, approximately 1 to 80, approximately 1 to 70, approximately 1 to 60, or approximately 5 to 60, m may be in a range of approximately 1 to 500, approximately 1 to 400, approximately 1 to 300, approximately 1 to 200, approximately 1 to 100, approximately 1 to 90, approximately 1 to 80, approximately 1 to a70, approximately 1 to 60, approximately 5 to 60, approximately 5 to 50, approximately 5 to 40, or approximately 5 to 30, and n may be in a range of approximately 0.1 to 50, approximately 0.1 to 40, approximately 0.1 to 30, approximately 0.1 to 20, approximately 0.1 to 10, approximately 0.1 to 5, approximately 0.1 to 4, approximately 0.1 to 3, or approximately 0.1 to 2. When l, m and/or n in Formula A are present in plural numbers, the units D of Formulas 1 to 3 may be, for example, alternately disposed with regular periodicity as seen in a shape of a block copolymer, or irregularly disposed as seen in a shape of a random copolymer.

In Formula A, l/m may be in a range of approximately 1 to 5, or approximately 1.5 to 3. Also, in Formula A, n/(l+m) may be in a range of approximately 0.005 to 0.05, or approximately 0.01 to 0.05.

The linear polysiloxane may be prepared, for example, using a method of preparing a conventional siloxane compound as known in the related art. For example, the compounds may be prepared by properly hydrolyzing and condensing an organosilane compound containing a functional group, such as a halogen or an alkoxy group, which may take part in a hydrolytic and/or condensation reaction, or a partially hydrolyzed/condensed product thereof in consideration of a desired siloxane unit.

For example, the hydrolytic and condensation reaction may be performed in the presence of an acid catalyst or a base catalyst. Also, the organosilane compound that may be used herein may, for example, include a compound represented by the expression: $Z_nSiX_{(4-n)}$. As such, X is a hydrolytic group, for example, a halogen such as chlorine, or an alkoxy group, and n is an integer ranging from 2 to 3. As such, Z may also be a substituent bound to a silicon atom, which may be properly selected in consideration of a desired substituent of the polysiloxane.

The linear polysiloxane may be prepared, for example, by subjecting a cyclic siloxane compound to a ring-opening reaction. For example, the ring-opening reaction may be performed in the presence of a base catalyst.

As known in the related art, there are various methods, such as a re-equilibration reaction, that can be used to prepare a polysiloxane, and a person having ordinary skill in the art may properly select and employ the known methods in consideration of a target product.

The curable composition may include a silicon compound containing a hydrogen atom bound to a silicon atom. For example, the silicon compound may serve as a cross-linking agent that cross-links the linear polysiloxane in a curing process.

A compound that may serve as a cross-linking agent as described above may be used as the silicon compound without particular limitation. For example, a compound known in the related art may be used as the silicon compound.

The silicon compound may include at least one hydrogen atom bound to a silicon atom. In this case, such a hydrogen atom may react with an alkenyl group of the linear polysiloxane. For example, a molar ratio (H/Si) of hydrogen atoms (H) bound to silicon atoms with respect to the total silicon atoms (Si) included in the silicon compound may be in a range of 0.2 to 0.8, or 0.3 to 0.75. Within this molar ratio range, a curing property of the composition may be properly maintained, and crack resistance and thermal shock resistance of a cured product may also be properly maintained.

The silicon compound may include at least one aryl group bound to a silicon atom, for example, an aryl group having 6 to 25 carbon atoms. When the silicon compound includes an aryl group, a refractive index or hardness and moisture permeability of the cured product thereof may be more properly maintained. According to one exemplary embodiment, a molar ratio (Ar/Si) of the total aryl groups (Ar) included in the silicon compound with respect to the total silicon atoms (Si) included in the silicon compound may be, for example, in a range of 0.4 to 1.5, or 0.5 to 1.2. Within this molar ratio range, viscosity, a refractive index or hardness of the curable composition or cured product thereof may be excellently maintained.

Also, the silicon compound may have a viscosity at 25° C. of 1,000 cP or less, or 500 cP or less. Within this viscosity range, processability or hardness of the curable composition may be properly maintained.

In addition, the silicon compound may have a molecular weight of less than 1,000 or less than 800. Within this molecular weight range, hardness of the cured product may be properly maintained. Also, a lower limit of the molecular weight of the silicon compound is not particularly limited, and may be, for example, approximately 250.

According to one exemplary embodiment, a compound including a unit represented by the following Formula 4 may be, for example, used as the silicon compound.

  [Formula 4]

In Formula 4, Y represents a monovalent hydrocarbon group having 1 to 25 carbon atoms, a is in a range of 0.3 to 1, and b is in a range of 0.9 to 2.

Unless particularly defined otherwise in this specification, for example, the term "monovalent hydrocarbon group" may refer to a monovalent residue derived from an organic compound composed of carbon and hydrogen atoms, or a derivative thereof. For example, the monovalent hydrocarbon group that may be used herein may include an alkyl group, an alkenyl group, an alkoxy group, or an aryl group. As such, specific kinds of the alkyl group, the alkenyl group, the alkoxy group or the aryl group are as listed above.

When Y in Formula 4 is present in plural numbers, Y may be the same as or different from each other.

For example, the silicon compound including the unit of Formula 4 may include compounds represented by the following Formulas B to G, but the present invention is not limited thereto.

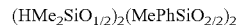  [Formula B]

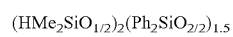  [Formula C]

  [Formula D]

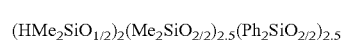  [Formula E]

  [Formula F]

  [Formula G]

In Formulas B to G, Me represents a methyl group, and Ph represents a phenyl group.

The above-described silicon compound may be prepared, for example, using a method used to prepare a linear polysiloxane.

For example, the silicon compound may be included in an amount of 10 to 500 parts by weight, or 50 to 400 parts by weight, relative to 100 parts by weight of the linear polysiloxane.

However, the content of the silicon compound is one exemplary embodiment, and may be, for example, specifically set based on an amount of the alkenyl groups present in the curable composition. For example, the silicon compound may be present in the curable composition so that a molar ratio (H/Ak) of hydrogen atoms (H) present in the silicon compound with respect to the total alkenyl groups present in the curable composition, for example, the total alkenyl groups (Ak) present in the linear polysiloxane or present in the linear polysiloxane and a cross-linked polysiloxane to be described later, can be in a range of approximately 0.8 to 1.2. Within this molar ratio range, a curing property of the curable composition, and hardness and thermal shock resistance of the cured product thereof may be excellently maintained.

Also, the curable composition may further include a cross-linked polysiloxane as a certain component.

In this specification, the term "cross-linked polysiloxane" may refer to a polysiloxane including at least a unit T or a unit Q.

That is, according to one exemplary embodiment, the cross-linked polysiloxane includes at least one siloxane unit selected from the group consisting of the units M, D, T and Q. In this case, the cross-linked polysiloxane may be a polysiloxane in which the unit T or Q is essentially present among the siloxane units included in the cross-linked polysiloxane.

The cross-linked polysiloxane may include at least one alkenyl group bound to a silicon atom. According to one exemplary embodiment, a molar ratio (Ak/Si) of alkenyl groups (Ak) included in the cross-linked polysiloxane with respect to the total silicon atoms (Si) included in the cross-linked polysiloxane may be, for example, in a range of 0.15 to 0.4, or 0.15 to 0.35. Within this molar ratio range, a curing property, crack resistance and thermal shock resistance of the curable composition or cured product thereof may be properly maintained.

In consideration of the refractive index or hardness, the cross-linked polysiloxane may include at least one aryl group bound to a silicon atom. According to one exemplary embodiment, a molar ratio (Ar/Si) of the total aryl groups (Ar) included in the cross-linked polysiloxane with respect to the total silicon atoms (Si) included in the cross-linked polysiloxane may be, for example, in a range of 0.4 to 1.2, or 0.4 to 1.0. Within this molar ratio range, a refractive index, hardness and viscosity of the curable composition or cured product thereof may be properly maintained.

Also, the cross-linked polysiloxane may have a viscosity at 25° C. of 1,000 cP or more, or 2,000 cP or more. Within this viscosity range, processability of the curable composition and hardness of the cured product may be excellently maintained. An upper limit of the viscosity of the cross-linked polysiloxane is not particularly limited.

In addition, the cross-linked polysiloxane may have a molecular weight of 300 to 10,000, or 500 to 5,000. Within this molecular weight range, formability, hardness and viscosity of the composition or cured product thereof may be properly maintained.

According to one exemplary embodiment, the cross-linked polysiloxane may be represented by an average composition equation of the following Formula 5.

$$(R^5R^6R^7SiO_{1/2})_c(R^8R^9SiO_{2/2})_d(R^{10}SiO_{3/2})_e(SiO_{4/2})_f$$ [Formula 5]

In Formula 5, $R^5$ to $R^{10}$ are each independently hydrogen, an alkyl group having 1 to 20 carbon atoms, an alkoxy group having 1 to 20 carbon atoms, a hydroxyl group, an epoxy group, an alkenyl group having 2 to 20 carbon atoms or an aryl group having 6 to 25 carbon atoms, provided that, when each of $R^5$ to $R^{10}$ is present in plural numbers, each of $R^5$ to $R^{10}$ may be the same as or different from each other, and at least one of $R^5$ to $R^{10}$ is an alkenyl group having 2 to 20 carbon atoms, and provided that, when c+d+e+f is set to 1, c is in a range of 0 to 0.5, d is in a range of 0 to 0.3, e is in a range of 0 to 0.8, and f is in a range of 0 to 0.2, provided that e and f are not 0 at the same time.

In this specification, a polysiloxane represented by a predetermined average composition equation includes a case in which a polysiloxane is composed of a single component represented by the predetermined average composition equation, as well as cases in which the polysiloxane is composed of a mixture of at least two components, and an average composition of the two components is represented by the predetermined average composition equation.

In the cross-linked polysiloxane, the units M, D, T and Q may be properly allocated in consideration of a purpose. In the average composition equation of Formula 5, (e+(4/3)f)/(c+2d) may be, for example, in a range of approximately 2 to 5, or approximately 2 to 4. Also, e/(e+f) in the average composition equation of Formula 5 may be equal to or greater than approximately 0.85, or approximately 0.9. When the units M, D, T and Q are allocated as described above, hardness, crack resistance and thermal shock resistance of the curable composition or cured product thereof may be excellently maintained. Meanwhile, an upper limit of e/(e+f) in Formula 5 may be 1.

Examples of the cross-linked polysiloxane may include compounds represented by the following Formulas H to M, but the present invention is not limited thereto.

   [Formula H]

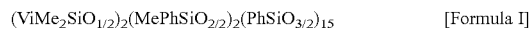   [Formula I]

   [Formula J]

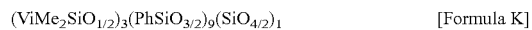   [Formula K]

   [Formula L]

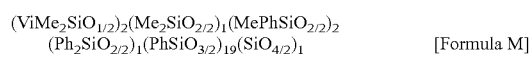   [Formula M]

In Formulas H to M, Vi, Me and Ph represent a vinyl group, a methyl group and a phenyl group, respectively.

For example, the cross-linked polysiloxane may be prepared in the same manner as in the linear polysiloxane.

The cross-linked polysiloxane may be, for example, included in an amount of 50 to 700 parts by weight, or 50 to 500 parts by weight, relative to 100 parts by weight of the linear polysiloxane. Within this content range, hardness, crack resistance and thermal shock resistance of the curable composition or cured product thereof may be properly maintained.

In the curable composition, the silicon compound or cross-linked polysiloxane containing a hydrogen atom may include at least one aryl group bound to a silicon atom, as described above. According to one exemplary embodiment, a molar ratio (Ar/Si) of the total aryl groups (Ar) bound to silicon atoms included in the curable composition with respect to the total silicon atoms (Si) included in the curable composition may be, for example, in a range of 0.4 to 1.5, or 0.7 to 1.2. Within this molar ratio range, hardness, viscosity and a refractive index of the curable composition or cured product thereof may be properly maintained.

In the curable composition including the cross-linked polysiloxane according to one exemplary embodiment, both the silicon compound and cross-linked polysiloxane may include at least one aryl group bound to a silicon atom.

In this case, the curable composition may satisfy the requirements of the following General Formula 1 and/or 2.

   [General Formula 1]

   [General Formula 2]

In General Formulas 1 and 2, $X_{(A)}$ is a molar ratio (Ar/Si) of the total aryl groups (Ar) included in the linear polysiloxane with respect to the total silicon atoms (Si) included in the linear polysiloxane, $X_{(B)}$ is a molar ratio (Ar/Si) of the total aryl groups (Ar) included in the silicon compound with respect to the total silicon atoms (Si) included in the silicon compound, and $X_{(C)}$ is a molar ratio (Ar/Si) of the total aryl groups (Ar) included in the cross-linked polysiloxane with respect to the total silicon atoms (Si) included in the cross-linked polysiloxane.

When the absolute value of a difference between $X_{(A)}$ and $X_{(C)}$ and/or the absolute value of a difference between $X_{(C)}$ and $X_{(B)}$ is set to 0.4 or less, compatibility between components of the curable composition may be properly maintained, and transparency of the curable composition or cured product thereof may also be properly maintained. According to another exemplary embodiment, the absolute value of the difference between $X_{(A)}$ and $X_{(C)}$ and/or the absolute value of the difference between $X_{(C)}$ and $X_{(B)}$ may be less than 0.4.

In addition, the curable composition may further include a hydrosilylation reaction catalyst. In this case, the hydrosilylation reaction catalyst may be added to facilitate curing and cross-linking reactions of the components of the curable composition.

A conventional hydrosilylation reaction catalyst known in the related art may be used as the hydrosilylation reaction catalyst without particular limitation.

For example, the hydrosilylation reaction catalyst that may be used herein may include at least one selected from the group consisting of a platinum-based catalyst, a palladium-based catalyst and a rhodium-based catalyst. For example, a platinum-based catalyst may be used in the curable composition. In general, chloroplatinic acid, platinum tetrachloride, an olefin complex of platinum, an alkenyl siloxane complex of platinum, and/or a carbonyl complex of platinum may be used as the platinum-based catalyst.

For example, the curable composition may include the hydrosilylation reaction catalyst at an effective amount to serve as a catalyst. For example, the hydrosilylation reaction catalyst may be used so that an atomic weight may be in a range of approximately 0.1 ppm to 500 ppm, or approximately 0.2 ppm to 100 ppm, based on the mass of platinum, palladium or rhodium in the curable composition.

Also, the curable composition may further include a tackifier to improve an adhesive property to various bases. A component that can improve a self-adhesive property of the curable composition or cured product thereof, particularly a component that can improve a self-adhesive property for a metal and an organic resin, may be used as the tackifier.

The tackifier that may be used herein may include a silane compound containing one or two or more functional groups selected from the group consisting of an alkenyl group (i.e., a vinyl group), a (meth)acryloyloxy group, a hydrosilyl (SiH) group, an epoxy group, an alkoxy group, a carbonyl group and a phenyl group; or an organic silicon compound such as a cyclic or linear siloxane compound having 2 to 30 silicon atoms or 4 to 20 silicon atoms, but the present invention is not limited thereto.

When the tackifier is included in the composition, the tackifier may be, for example, included in an amount of approximately 0.1 to 10 parts by weight, relative to 100 parts by weight of the linear polysiloxane compound. However, the content of the tackifier may be properly altered in consideration of an effect of improving a desired adhesive property.

For example, the curable composition may further include particles such as inorganic particles. For example, particles having a refractive index such that an absolute value of a difference in refractive index between the particles and the composition or cured product thereof can be equal to or less than 0.1 may be used as the particles.

For example, when the particles are blended with a fluorescent material in the curable composition, precipitation of the fluorescent material caused during a curing process may be prevented, and heat resistance, a heat-dissipating property, and crack resistance may also be improved, thereby improving reliability as a whole. Since the particles have the refractive index, the particles may also serve to maintain transparency of the curable composition or cured product thereof while showing the above-described functions. Therefore, when the particles are applied to a device, brightness of the curable composition or cured product thereof may be improved.

Various kinds of particles used in the related art may all be used as the particles as long as an absolute value of a difference in refractive index between the composition excluding the above-described particles or a cured product thereof and the particles is equal to or less than 0.1. Here, the absolute value of the difference in refractive index between the composition excluding the particles or the cured product thereof and the particles may be preferably equal to or less than 0.07, more preferably 0.05. For example, the particles that may be used herein may include silica ($SiO_2$), organosilica, alumina, aluminosilica, titania, zirconia, cerium oxide, hafnium oxide, niobium oxide, tantalum pentoxide, indium oxide, tin oxide, indium tin oxide, zinc oxide, silicon, zinc sulfide, calcium carbonate, barium sulfate, aluminosilicate, or magnesium oxide. In this case, the particles may be in a porous shape or a hollow particle shape.

An average particle size of the particles may be, for example, in a range of 1 nm to 50 m, preferably 2 nm to 10 m. When the particles have an average particle size of 1 nm or more, the particles may be uniformly dispersed in the curable composition or cured product thereof. On the other hand, when the particles have an average particle size of 50 m or less, dispersion of the particles may be effectively performed, and precipitation of the particles may also be prevented.

The particles may be included in the curable composition in an amount of 0.1 to 30 parts by weight, or 0.2 to 10 parts by weight, relative to 100 parts by weight of the linear polysiloxane or the sum of linear polysiloxane and the cross-linked polysiloxane. When the content of the particles exceeds 0.1 parts by weight, precipitation of the fluorescent material may be effectively inhibited, or reliability of a device may be improved, whereas processability may be excellently maintained when the content of the particles is less than 30 parts by weight.

In addition to the above-described components, the curable composition may also include a reaction inhibitor such as 2-methyl-3-butyn-2-ol, 2-phenyl-3-1-butyn-2-ol, 3-methyl-3-penten-1-yne, 3,5,-dimethyl-3-hexen-1-yne or 1,3,5,7-tetramethyl,1,3,5,7-tetrahexenylcyclotetrasiloxane, as necessary. Also, the curable composition may further include a carbon-functional silane and a partially hydrolyzed/condensed product thereof, which contains an epoxy group and/or an alkoxysilyl group, or a tackifier such as a siloxane compound as any other component without causing damage to a desired purpose.

According to one exemplary embodiment, the curable composition may also further include a fluorescent material. Kinds of fluorescent materials that may be used herein are not particularly limited. For example, a kind of a conventional fluorescent material applied to an LED package may be used to realize white light.

Another aspect of the present invention provides a semiconductor device. The semiconductor device according to one exemplary embodiment may be encapsulated by an encapsulation material including a cured product of the curable composition.

As such, examples of the semiconductor device encapsulated by the encapsulation material may include a diode, a transistor, a thyristor, a photo coupler, a charge coupled device (CCD), a solid-phase image pickup device, an integral integrated circuit (IC), a hybrid IC, a large-scale integration (LSI), a very-large-scale integration (VLSI), and an LED.

According to one exemplary embodiment, the semiconductor device may be a light emitting diode.

For example, the light emitting diode that may be used herein may include a light emitting diode formed by stacking a semiconductor material on a substrate. Examples of the semiconductor material may include GaAs, GaP, GaAlAs, GaAsP, AlGaInP, GaN, InN, AlN, InGaAlN or SiC, but the present invention is not limited thereto. Also, examples of the substrate may include a monocrystalline material such as sapphire, spinel, SiC, Si, ZnO or GaN.

In manufacture of an LED, a buffer layer may also be formed between the substrate and the semiconductor material, as necessary. GaN or AlN may be used for the buffer layer. A method of stacking a semiconductor material on a substrate is not particularly limited. For example, the semiconductor material may be stacked using a method such as metal organic chemical vapor deposition (MOCVD), hydride vapor phase epitaxy (HDVPE) or congruent melt growth. Also, a structure of the LED may be, for example, a mono-junction, a heterojunction, or a dual heterojunction junction such as an MIS junction, a PN junction, or a PIN junction. Also, the LED may be formed with a single or multiple quantum well structure.

According to one exemplary embodiment, an emission wavelength of the LED may be, for example, in a range of 250 nm to 550 nm, preferably 300 nm to 500 nm, and more preferably 330 nm to 470 nm. The emission wavelength may refer to a major emission peak wavelength. When the emission wavelength of the LED is set to this wavelength range, a white LED having high energy efficiency and excellent color reproducibility may be obtained with a longer lifespan.

The LED may be encapsulated using the curable composition. Also, the LED may be encapsulated only by the curable composition, or another encapsulation material may be optionally used together with the curable composition. When two kinds of encapsulation materials are used together, encapsulation of an LED may be performed by encapsulating the LED with the curable composition and encapsulating the curable composition with another encapsulation material, or by encapsulating the LED with another encapsulation material and encapsulating the encapsulation material with the curable composition. Another encapsulation material may include an epoxy resin, a silicone resin, an acrylic resin, a urea resin, an imide resin, or glass.

As a method of encapsulating an LED with the curable composition, for example, a method of injecting a curing composition into a mold-type cast in advance, dipping a lead frame in which an LED is fixed in the curable composition and curing the curable composition, or a method of injecting a curing composition into a cast having an LED inserted therein and curing the curing composition may be used. A method of injecting a composition may include injection using a dispenser, transfer molding, or injection molding. As another encapsulation method, a method of coating a composition on an LED using a method such as dripping, stencil printing, or screen printing, or a mask and curing the composition, or a method of injecting a composition into a cup having an LED disposed at a lower portion thereof using a dispenser and curing the composition may also be used.

Also, the composition may be used as a die-bond material for fixing an LED in a lead terminal or a package, or used for a passivation film or a package substrate formed on an LED, as necessary.

When curing of the composition is required, the curing method is not particularly limited. For example, the composition may be cured at a constant temperature of 60° C. to 200° C. for 10 minutes to 5 hours, or a series of curing processes may be carried out by performing two or more operations at a suitable temperature for a suitable period of time.

The shape of the encapsulation material is not particularly limited. For example, the encapsulation material may be formed in the form of a shell-shaped lens, a plate or a thin film.

Also, performance of the LED may be further improved using a method known in the prior art. For example, a method of improving performance may include a method of installing a light-reflecting layer or a light-condensing layer in a rear surface of an LED, a method of forming a complementary color-tinting unit at a bottom surface of an LED, a method of installing a layer for absorbing light having a shorter wavelength than a major emission peak on an LED, a method of encapsulating an LED and further molding the LED with a hard material, a method of fixing an LED in a through hole, or a method of bringing an LED into contact with a lead member using a method such as flip-chip bonding and extracting light in a direction of a substrate.

For example, the LED may be effectively applied to backlights for LCDs, lightings, light sources for various sensors, printers or photocopiers, light sources for dashboards in vehicles, traffic lights, pilot lamps, light sources for display devices or planar light-emitting bodies, displays, decorations, or various lights.

Advantageous Effects

The curable composition according to one exemplary embodiment may show excellent processability and workability. Also, the curable composition may have a high refractive index before or after curing. The composition has low moisture permeability before or after curing, and shows excellent crack resistance, thermal shock resistance, adhesive property and hardness. In addition, the composition does not cause color change such as whitening under a high-temperature or high-humidity condition, and does not exhibit stickiness on a surface thereof. According to one exemplary embodiment, the curable composition may be used as an adhesive material or as an encapsulation material for semiconductor devices such as an LED, a CCD, a photo coupler, or a photovoltaic cell.

BEST MODE

Hereinafter, the curable composition will be described in detail with reference to Examples and Comparative Examples. However, it should be understood that the following Examples are not intended to limit the scope of the curable composition.

Hereinafter, the symbols Vi, Ph, Me and Ep represent a vinyl group, a phenyl group, a methyl group and a glycidoxypropyl group, respectively.

Also, the physical properties are measured as follows.

1. Evaluation of Hardness

Each of the curable compositions prepared in Examples and Comparative Examples was injected into a square specimen mold, and cured at 150° C. for 1 hour to prepare a specimen. Then, the specimen was measured for hardness using a Shore-D durometer (specimen thickness: 4 mm).

2. Measurement of Refractive Index

The curable compositions prepared in Examples and Comparative Examples were dispensed in an aluminum dish, and cured at 150° C. for 1 hour. Thereafter, the curable compositions were measured for refractive index using an Abbe refractometer. nD of a test piece used was 1.7393.

3. Measurement of Light Transmittance

Each of the curable compositions prepared in Examples and Comparative Examples was injected between two glass plates with a 1 mm-thick spacer interposed therebetween, and cured at 150° C. for 1 hour. Then, the curable compositions were measured for light transmittance in a thickness direction of a specimen with respect to light with a wavelength of 450 nm using a UV-vis spectrometer.

4. Measurement of Moisture Permeability

Each of the curable compositions prepared in Examples and Comparative Examples was injected between two glass plates with a 1 mm-thick spacer interposed therebetween, cured at 150° C. for 1 hour, and then cut into pieces having a suitable size to be installed in equipment, thereby preparing specimens. The moisture permeability of the specimens having an area of 10 cm$^2$ was continuously measured at a temperature of 37.8° C. and a relative humidity of 100% for at least one day using a moisture permeability measurement apparatus, Mocon WVTR permatron-W. Then, a value (unit: g/m$^2$/day) at a point of time at which the moisture permeability stabilized was calculated.

5. Evaluation of Adhesive Property

A Teflon guard was used to prepare a casting, which had a shape of 10 mm×4 mm (width×height), on polyphthalamide (PPA), and each of the curable compositions prepared in Examples and Comparative Examples was dispensed on the casting, and cured at a constant temperature of 150° C. for 1 hour. In this procedure, a cured product having a size of 10 mm×4 mm×1 mm (width×height×thickness) formed on the PPA was prepared, and the peel strength obtained by peeling the cured product from an interface between the cured product and the PPA was measured 10 times using a TA-XT analyzer, and an average value of the peel strengths (gf/mm) was calculated.

SYNTHESIS EXAMPLE 1

Preparation of Linear Polysiloxane (A)

25.0 g of octamethylcyclotetrasiloxane, 66.85 g of octaphenylcyclotetrasiloxane, 1.86 g of glycidoxypropyldimethoxymethylsilane and 6.28 g of divinyltetramethyldisiloxane were mixed, and 0.10 g of KOH was added to the resulting mixture. Then, the mixture was reacted at 110° C. for 4 hours. After the reaction, a low molecular weight material was removed from a reaction product to prepare a linear polysiloxane (A) represented by the expression $(ViMe_2SiO_{1/2})_2(Me_2SiO_{2/2})_{10}(Ph_2SiO_2)_{10}(MeEpSiO_{2/2})_{0.25}$. The linear polysiloxane (A) was obtained in the form of a clear oil having a molecular weight of approximately 4,090 and a viscosity at 25° C. of approximately 18,800 cP.

SYNTHESIS EXAMPLE 2

Preparation of Linear Polysiloxane (B)

A linear polysiloxane (B) represented by the expression $(ViMe_2SiO_{1/2})_2(Me_2SiO_{2/2})_{10}(Ph_2SiO_{2/2})_{10}(MeEpSiO_{2/2})_{0.50}$ was prepared in the same manner as in Synthesis Example 1, except that the glycidoxypropyldimethoxymethylsilane was used in an amount of 3.71 g. The linear polysiloxane (B) was obtained in the form of a clear oil having a molecular weight of approximately 3,939 and a viscosity at 25° C. of approximately 18,100 cP.

SYNTHESIS EXAMPLE 3

Preparation of Linear Polysiloxane (C)

A linear polysiloxane (B) represented by the expression $(ViMe_2SiO_{1/2})_2(Me_2SiO_{2/2})_{10}(Ph_2SiO_{2/2})_{10}$ was prepared in the same manner as in Synthesis Example 1, except that the glycidoxypropyldimethoxymethylsilane was not used. The linear polysiloxane (C) was obtained in the form of a clear oil having a molecular weight of approximately 4,532 and a viscosity at 25° C. of approximately 21,000 cP.

SYNTHESIS EXAMPLE 4

Preparation of Linear Polysiloxane (D)

A linear polysiloxane (D) represented by the expression $(ViMe_2SiO_{1/2})_2(Me_2SiO_{2/2})_{10}(Ph_2SiO_{2/2})_{10}(MeEpSiO_{2/2})_{2.0}$ was prepared in the same manner as in Synthesis Example 1, except that the glycidoxypropyldimethoxymethylsilane was used in an amount of 14.86 g. The linear polysiloxane (D) was obtained in the form of a pale yellow oil having a molecular weight of approximately 2,714 and a viscosity at 25° C. of approximately 12,700 cP.

SYNTHESIS EXAMPLE 5

Preparation of Linear Polysiloxane (E)

25.0 g of octamethylcyclotetrasiloxane, 300.8 g of octaphenylcyclotetrasiloxane, 4.0 g of glycidoxypropyldimethoxymethylsilane and 6.4 g of divinyltetramethyldisiloxane were mixed, and 0.10 g of KOH was added to the resulting mixture. Then, the mixture was reacted at 110° C. for 4 hours. After the reaction, a low molecular weight material was removed from the reaction product to prepare a linear polysiloxane (E) represented by the expression $(ViMe_2SiO_{1/2})_2(Me_2SiO_{2/2})_{10}(Ph_2SiO_2)_{45}(MeEpSiO_{2/2})_{0.69}$. The linear polysiloxane (E) was obtained in the form of a gum having a molecular weight of approximately 3,090 and showing no flowability at 25° C.

SYNTHESIS EXAMPLE 6

Preparation of Linear Polysiloxane (F)

25.0 g of octamethylcyclotetrasiloxane, 367.7 g of octaphenylcyclotetrasiloxane, 5.2 g of glycidoxypropyldimethoxymethylsilane and 6.0 g of divinyltetramethyldisiloxane were mixed, and 0.10 g of KOH was added to the resulting mixture. Then, the mixture was reacted at 110° C. for 4 hours. After the reaction, a low molecular weight material was removed from the reaction product to prepare a linear polysiloxane (F) represented by the expression $(ViMe_2SiO_{1/2})_2(Me_2SiO_{2/2})_{10}(Ph_2SiO_2)_{55}(MeEpSiO_{2/2})_{0.69}$. The linear polysiloxane (F) was obtained in the form of a gum having a molecular weight of approximately 3,520 and showing no flowability at room temperature.

SYNTHESIS EXAMPLE 7

Preparation of Linear Polysiloxane (G)

25.0 g of octamethylcyclotetrasiloxane, 33.4 g of octaphenylcyclotetrasiloxane, 1.9 g of glycidoxypropyldimethoxymethylsilane and 1.6 g of divinyltetramethyldisiloxane were mixed, and 0.10 g of KOH was added to the resulting mixture. Then, the mixture was reacted at 110° C. for 4 hours. After the reaction, a low molecular weight material was removed from the reaction product to prepare a linear polysiloxane (G) represented by the expression $(ViMe_2SiO_{1/2})_2(Me_2SiO_{2/2})_4(Ph_2SiO_2)_{20}(MeEpSiO_{2/2})_{1.0}$. The linear polysiloxane (G) was obtained in the form of a clear oil having a molecular weight of approximately 36,870 and a viscosity at 25° C. of approximately 10,500 cP.

SYNTHESIS EXAMPLE 8

Preparation of Linear Polysiloxane (H)

25.0 g of octamethylcyclotetrasiloxane, 45.93 g of tetraphenyltetramethylcyclotetrasiloxane, 1.86 g of glycidoxypropyldimethoxymethylsilane and 0.6 g of divinyltetramethyldisiloxane were mixed, and 0.10 g of KOH was added to the resulting mixture. Then, the mixture was reacted at 110° C. for 4 hours. After the reaction, a low molecular weight material was removed from the reaction product to prepare a linear polysiloxane (H) represented by the expression $(ViMe_2SiO_{1/2})_2(Me_2SiO_{2/2})_{100}(PhMeSiO_2)_{100}(MeEpSiO_{2/2})_{2.5}$. The linear polysiloxane (H) was obtained in the form of a clear oil having a molecular weight of approximately 18,630 and a viscosity at 25° C. of approximately 13,200 cP.

EXAMPLE 1

10 g of the polysiloxane compound (A), 30 g of a polysiloxane (molecular weight: approximately 1,500) represented by the average composition equation $(ViMe_2SiO_{1/2})(PhSiO_{3/2})_4$ as a cross-linked polysiloxane, and 11 g of a silicon compound including a unit $(H_{0.7}Me_{1.3}Ph_{0.7}SiO_{0.7})$ and having a dendritic structure and a molecular weight of approximately 750 were blended, and a platinum-based catalyst (Platinum(0)-1,3-divinyl-1,1,3,3-tetramethyldisiloxane) was further blended so thin an amount of Pt(0) amounted to approximately 15 ppm, thereby preparing a curable composition.

EXAMPLE 2

A curable composition was prepared in the same manner as in Example 1, except that 10 g of the polysiloxane (B) prepared in Synthesis Example 2 was used instead of the polysiloxane (A).

EXAMPLE 3

A curable composition was prepared in the same manner as in Example 1, except that 10 g of the polysiloxane (E) prepared in Synthesis Example 5 was used instead of the polysiloxane (A).

COMPARATIVE EXAMPLE 1

A curable composition was prepared in the same manner as in Example 1, except that 10 g of the polysiloxane (C) prepared in Synthesis Example 3 was used instead of the polysiloxane (A).

COMPARATIVE EXAMPLE 2

A curable composition was prepared in the same manner as in Example 1, except that 10 g of the polysiloxane (D) prepared in Synthesis Example 4 was used instead of the polysiloxane (A).

COMPARATIVE EXAMPLE 3

A curable composition was prepared in the same manner as in Example 1, except that 10 g of the polysiloxane (C) prepared in Synthesis Example 3 was used instead of the polysiloxane (A), and 1 g of a tackifier $((ViMe_2SiO_{1/2})_{20}(PhSiO_{3/2})_{74}(EpSiO_{3/2})_{40}$, molecular weight: approximately 1,696, and viscosity (25° C.): approximately 8,160 cP) was further blended in the composition.

COMPARATIVE EXAMPLE 4

A curable composition was prepared in the same manner as in Example 1, except that 10 g of the polysiloxane (F) prepared in Synthesis Example 6 was used instead of the polysiloxane (A). However, a moldable cured product was not obtained.

COMPARATIVE EXAMPLE 5

A curable composition was prepared in the same manner as in Example 1, except that 10 g of the polysiloxane (G) prepared in Synthesis Example 7 was used instead of the polysiloxane (A).

COMPARATIVE EXAMPLE 6

A curable composition was prepared in the same manner as in Example 1, except that 10 g of the polysiloxane (H) prepared in Synthesis Example 8 was used instead of the polysiloxane (A). However, a moldable cured product was not obtained.

The physical properties measured for the respective curable compositions are summarized and listed in the following Tables 1 and 2.

TABLE 1

| | Examples | | |
|---|---|---|---|
| | 1 | 2 | 3 |
| Hardness | 32 | 34 | 45 |
| Refractive index | 1.550 | 1.549 | 1.556 |
| Light transmittance (%) | 99.2 | 99.0 | 99.1 |
| Moisture permeability (g/m²/day) | 10.2 | 10.3 | 9.8 |
| Peel strength (gf/mm) | 332 | 350 | 360 |

TABLE 2

| | Comparative Examples | | | | | |
|---|---|---|---|---|---|---|
| | 1 | 2 | 3 | 4 | 5 | 6 |
| Hardness | 32 | 32 | 20 | Not measured | 22 | 18 |
| Refractive index | 1.550 | 1.543 | 1.540 | Not measured | 1.523 | 1.521 |
| Light transmittance (%) | 99.1 | 95.3 | 99.1 | Not measured | 99.0 | 99.1 |

TABLE 2-continued

| | Comparative Examples | | | | | |
|---|---|---|---|---|---|---|
| | 1 | 2 | 3 | 4 | 5 | 6 |
| Moisture permeability (g/m²/day) | 12.9 | 10.1 | 11.5 | Not measured | 12.7 | 12.8 |
| Peel strength (gf/mm) | 89 | 356 | 205 | Not measured | 153 | 124 |

As seen from Tables 1 and 2, it was confirmed that the curable compositions prepared in the Examples had excellent hardness, refractive index, light transmittance and water resistance and also showed a superior adhesive property.

Meanwhile, it was seen that the curable composition prepared in Comparative Example 1, which did not include the unit corresponding to Formula 3, showed very poor adhesive property and water resistance, and the curable composition of Comparative Example 3 including the tackifier had an improved adhesive property compared with that of Comparative Example 1, but still had a poor adhesive property compared with those of Examples.

Also, it was seen that the light transmittance was not maintained at a practical level in the case of Comparative Example 2 including an excessive amount of the unit corresponding to Formula 3.

In addition, it was confirmed that the curable composition was not molded from the very beginning in the case of Comparative Example 4 in which a linear polysiloxane in which the unit of Formula 1 was included at an excessively high molar number was used, and thus the physical properties of the curable composition were not measured.

Also, it was confirmed that the curable composition prepared in Comparative Example 5, in which a linear polysiloxane in which a mole number of the unit of Formula 1 was excessively lower than that of the unit of Formula 2 was used, generally showed poor performance such as moisture permeability, hardness or refractive index.

Furthermore, it was seen that a cured product showed very low hardness and moisture barrier characteristics in the case of Comparative Example 6 in which a linear siloxane, which was similar to the siloxane unit of Formula 1 but included a siloxane unit including only one aryl group instead of the unit of Formula 1, was used.

The invention claimed is:

1. A curable composition comprising:
a linear polysiloxane, which comprises an alkenyl group bound to a silicon atom, which comprises siloxane units represented by the following Formulas 1 to 3, and in which a mole number of the siloxane unit of Formula 1 is 1 to 5 times as large as a mole number of the siloxane unit of Formula 2, and a mole number of the siloxane unit of Formula 3 is 0.005 to 0.05 times as large as a mole number of the sum of the siloxane units of Formulas 1 and 2; and
a silicon compound comprising a hydrogen atom bound to a silicon atom:

$R^a R^b SiO_{2/2}$ [Formula 1]

$R^c R^d SiO_{2/2}$ [Formula 2]

$R^e R^f SiO_{2/2}$ [Formula 3]

wherein $R^a$ and $R^b$ are each independently an aryl group having 6 to 25 carbon atoms, $R^f$ is hydrogen, an alkyl group having 1 to 20 carbon atoms, an alkoxy group having 1 to 20 carbon atoms, a hydroxyl group, an epoxy group, an alkenyl group having 2 to 20 carbon atoms, or an aryl group having 6 to 25 carbon atoms, $R^c$ and $R^d$ are each independently an alkyl group having 1 to 20 carbon atoms, and $R^e$ is an epoxy group.

2. The curable composition of claim 1, wherein $R^f$ in the siloxane unit of Formula 3 is an alkyl group having 1 to 20 carbon atoms.

3. The curable composition of claim 1, wherein the linear polysiloxane comprises an alkenyl group bound to a silicon atom at an end of the polysiloxane.

4. The curable composition of claim 1, wherein the linear polysiloxane has a viscosity at 25° C. of 500 cP to 100,000 cP.

5. The curable composition of claim 1, wherein the linear polysiloxane has a weight average molecular weight of 500 to 50,000.

6. The curable composition of claim 1, wherein the linear polysiloxane is represented by the following Formula A:

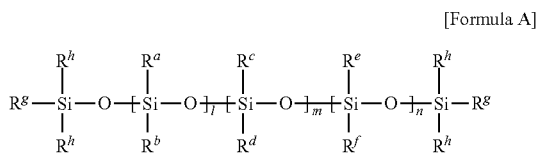

[Formula A]

wherein $R^a$ and $R^b$ are each independently an aryl group having 6 to 25 carbon atoms, $R^f$ is hydrogen, an alkyl group having 1 to 20 carbon atoms, an alkoxy group having 1 to 20 carbon atoms, a hydroxyl group, an epoxy group, an alkenyl group having 2 to 20 carbon atoms or an aryl group having 6 to 25 carbon atoms, $R^c$ and $R^d$ are each independently an alkyl group having 1 to 20 carbon atoms, $R^e$ is an epoxy group, $R^g$ is an alkenyl group having 2 to 20 carbon atoms, $R^h$ is each independently an alkyl group having 1 to 20 carbon atoms, and l, m and n are positive numbers, provided that l/m is in a range of 1 to 5, and n/(l+m) is in a range of 0.005 to 0.05.

7. The curable composition of claim 6, wherein $R^f$ in Formula A is an alkyl group having 1 to 20 carbon atoms.

8. The curable composition of claim 1, wherein the silicon compound comprises at least one aryl group that comprises 6 to 25 carbon atoms and is bound to a silicon atom.

9. The curable composition of claim 8, wherein a molar ratio of the aryl groups in the silicon compound with respect to the silicon atoms in the silicon compound is from 0.4 to 1.5.

10. The curable composition of claim 1, wherein the silicon compound has a viscosity at 25° C. of 1,000 cP or less.

11. The curable composition of claim 1, wherein the silicon compound has a weight average molecular weight of less than 1,000.

12. The curable composition of claim 1, wherein the silicon compound comprises a unit represented by the following Formula 4:

$H_a Y_b SiO_{(4-a-b)/2}$ [Formula 4]

wherein Y represents a monovalent hydrocarbon group having 1 to 25 carbon atoms, a is in a range of 0.3 to 1, and b is in a range of 0.9 to 2.

13. The curable composition of claim 1, wherein the silicon compound is comprised in an amount of 10 to 500 parts by weight, relative to 100 parts by weight of the linear polysiloxane.

14. The curable composition of claim 1, further comprising a cross-linked polysiloxane represented by an average composition equation of the following Formula 5:

$(R^5 R^6 R^7 SiO_{1/2})_c (R^8 R^9 SiO_{2/2})_d (R^{10} SiO_{3/2})_e (SiO_{4/2})_f$ [Formula 5]

wherein $R^5$ to $R^{10}$ are each independently hydrogen, an alkyl group having 1 to 20 carbon atoms, an alkoxy group having 1 to 20 carbon atoms, a hydroxyl group, an epoxy group, an alkenyl group having 2 to 20 carbon atoms or an aryl group having 6 to 25 carbon atoms, provided that, when each of $R^5$ to $R^{10}$ is present in plural numbers, each of $R^5$ to $R^{10}$ may be the same as or different from each other, and at least one of $R^5$ to $R^{10}$ is an alkenyl group having 2 to 20 carbon atoms, and provided that, when c+d+e+f is set to 1, c is in a range of 0 to 0.5, d is in a range of 0 to 0.3, e is in a range of 0 to 0.8, and f is in a range of 0 to 0.2, provided that e and f are not 0 at the same time.

15. A semiconductor device encapsulated by an encapsulation material comprising a cured product of the curable composition defined in claim 1.

16. A light emitting diode encapsulated by an encapsulation material comprising a cured product of the curable composition defined in claim 1.

17. A liquid crystal display device comprising the light emitting diode defined in claim 16 as a light source.

18. A lighting device comprising the light emitting diode defined in claim 16.

\* \* \* \* \*